United States Patent
Hemminger et al.

[11] Patent Number: 6,128,584
[45] Date of Patent: Oct. 3, 2000

[54] SYSTEM AND METHOD FOR FREQUENCY COMPENSATION IN AN ENERGY METER

[75] Inventors: Rodney C. Hemminger; Scott T. Holdsclaw, both of Raleigh; Vick A. Hubbard, Wake Forest, all of N.C.

[73] Assignee: ABB Power T&D Company Inc., Raleigh, N.C.

[21] Appl. No.: 09/201,640

[22] Filed: Nov. 30, 1998

[51] Int. Cl.[7] .................................................. G06F 19/00
[52] U.S. Cl. ............................. 702/75; 702/66; 702/73; 324/142
[58] Field of Search ........................... 702/60–62, 64–67, 702/73–75; 324/141, 142; 361/79, 85–87

[56] References Cited

U.S. PATENT DOCUMENTS

| | | | |
|---|---|---|---|
| 4,319,329 | 3/1982 | Girgis et al. ............................ | 702/75 |
| 4,884,021 | 11/1989 | Hammond et al. ..................... | 324/142 |
| 5,537,029 | 7/1996 | Hemminger et al. ................... | 324/142 |
| 5,537,333 | 7/1996 | Hemminger et al. ..................... | 702/60 |
| 5,544,089 | 8/1996 | Hemminger ........................... | 364/492 |
| 5,548,527 | 8/1996 | Hemminger et al. ..................... | 702/64 |
| 5,555,508 | 9/1996 | Munday et al. .......................... | 702/64 |

*Primary Examiner*—Marc S. Hoff
*Assistant Examiner*—Brian Bui
*Attorney, Agent, or Firm*—Woodcock Washburn Kurtz Mackiewicz & Norris LLP

[57] ABSTRACT

A system and method for improving the ability of an electronic meter to make measurements on signals to determine content of different frequencies, and harmonics of the fundamental frequency, of AC signals (voltages and currents). The line frequency is determined and compensated for prior to performing frequency-dependent parameter measurements or determining frequency-dependent parameters.

43 Claims, 3 Drawing Sheets

6,128,584

SYSTEM AND METHOD FOR FREQUENCY COMPENSATION IN AN ENERGY METER

FIELD OF THE INVENTION

The present invention relates in general to the field of electronic energy meters. More particularly, the present invention relates to electronic energy meters with systems for compensating for frequency variations in the electrical energy supply that is provided to the energy meter.

BACKGROUND OF THE INVENTION

The transfer of bulk energy through alternating voltages and currents is inherently done at some nominal frequency, typically at 50 or 60 Hz. Historically, small variations in the nominal line frequency were of little concern to electromechanical watthour metering. Electromechanical meters were limited to basic metrics such as watthours or VARhours using phase shifting transformers, and the accuracy of the results were not generally dependent on frequency.

The recent deregulation of the utility industry has created a market for products that facilitate the efficient distribution and monitoring or electrical power. In the past, utilities have built an infrastructure that did not provide adequate information to monitor and adjust the electrical energy in the distribution system.

One reason to monitor line frequency is the increased interest and concern with the accurate measurement of harmonics on the utility's power system. Historical metering practices had only a minor concern with harmonics, but today interest is much higher due to an increase in customer loads which generate harmonics on a utility's system. These harmonics can cause VA loads on transformers to be higher than expected as well as cause a customer's bill to actually go down when harmonic power is actually being drawn from the utility's system. Frequency compensation is desired to obtain accurate measurements of amounts of harmonics on voltage or current signals.

In the past few years, electronic energy meters have moved more into the digital world with analog-to-digital converters (ADCs) and digital processing. More recently, digital electricity meters have started including additional instrumentation features which allow the user to read near instantaneous value readings such as phase angles from one voltage to another voltage, phase angles from a current to a voltage, per phase power factors, per phase voltages, per phase currents, per phase voltage harmonics, per phase current harmonics, per phase and system watts, per phase and system volt-amperes (VAs), per phase and system volt-amperes reactive (VARs), and total harmonic distortions for per phase voltages and currents. One problem that must be considered is the problem of frequency dependency, especially on values such as per phase voltage and current harmonics.

Digital meters tend to repetitively process samples at fixed time intervals, and although some quantities may be calculated one set of samples at a time, other quantities are desirably averaged over one or more line cycle periods. Since a fixed sampling rate implies a fixed number of samples per line cycle period, the results are generally compensated for variations in line frequency to avoid errant results. A typical means to adjust RMS voltages, RMS currents, and Volt-Ampere (VA) apparent energy is to detect zero crossings of a signal and average the results by the number of samples incurred over that flexible period. However, other more complicated calculations, such as harmonics, cannot be totally compensated for after the measurements and interim calculations are done.

SUMMARY OF THE INVENTION

The present invention is directed to a system and method for improving the ability of an electronic meter to make measurements on signals to determine content of different frequencies, and harmonics of the fundamental frequency, of AC signals, and also the energy (watt, VAR, and VA) from the product of the voltage and currents of the specific frequencies. The line frequency is determined and compensated for prior to performing frequency-dependent parameter measurements or determining frequency-dependent parameters.

In one embodiment within the scope of the present invention, a method of compensating for a frequency variation in electrical energy provided to an energy meter via a service type is provided, comprising the steps of: measuring a frequency of the electrical energy; selecting a reference waveform having a positive zero crossing; synchronizing two ideal waveforms with the reference waveform, the two ideal waveforms each having an ideal frequency; obtaining an input signal waveform; determining a magnitude of a signal of the ideal frequency within the input signal waveform; and determining an angle of the signal of the ideal frequency within the input signal waveform. The resulting quantities can be used to quantify typically unwanted harmonics on individual signals as well as determine angles between the fundamentals of otherwise distorted signals.

The foregoing and other aspects of the present invention will become apparent from the following detailed description of the invention when considered in conjunction with the accompanying drawings.

DESCRIPTION OF EXEMPLARY EMBODIMENTS AND BEST MODE

The present invention is directed to a system and method for improving the ability of an electronic meter to make measurements on signals to determine content of different frequencies, and harmonics of the fundamental frequency, of AC signals (voltage and current). The line frequency is determined and compensated for prior to performing frequency-dependent parameter measurements or determining frequency-dependent parameters.

Most current solid state energy meters digitally sample voltage and current signals on one to three different phases, and process them to typically generate quantities for billing purposes (such as watthours, VARhours or VAhours). They are also becoming capable of determining a wide variety of instrumentation quantities. As an enhancement, these meters are also capable of processing these quantities to determine both the validity of the wiring external to the electronic meter itself, and other unusual parameters, such as harmonics.

In accordance with the present invention, systems and methods for line frequency variation detection and compensation will now be described with reference to the figures. It will be appreciated by those of ordinary skill in the art that the description given herein with respect to those figures is for exemplary purposes only and is not intended in any way to limit the scope of the invention. For example, during the description of the preferred embodiment of the detection method and system, an exemplary meter is used to illustrate the invention. However, such examples are merely for the purpose of clearly describing the methods and systems of the present invention and are not intended to limit the invention. Moreover, example applications are used throughout the description wherein the present invention is employed in conjunction with a particular electronic energy meter. That meter is not intended to limit the invention, as the invention is equally applicable to other metering systems.

Figure 1:
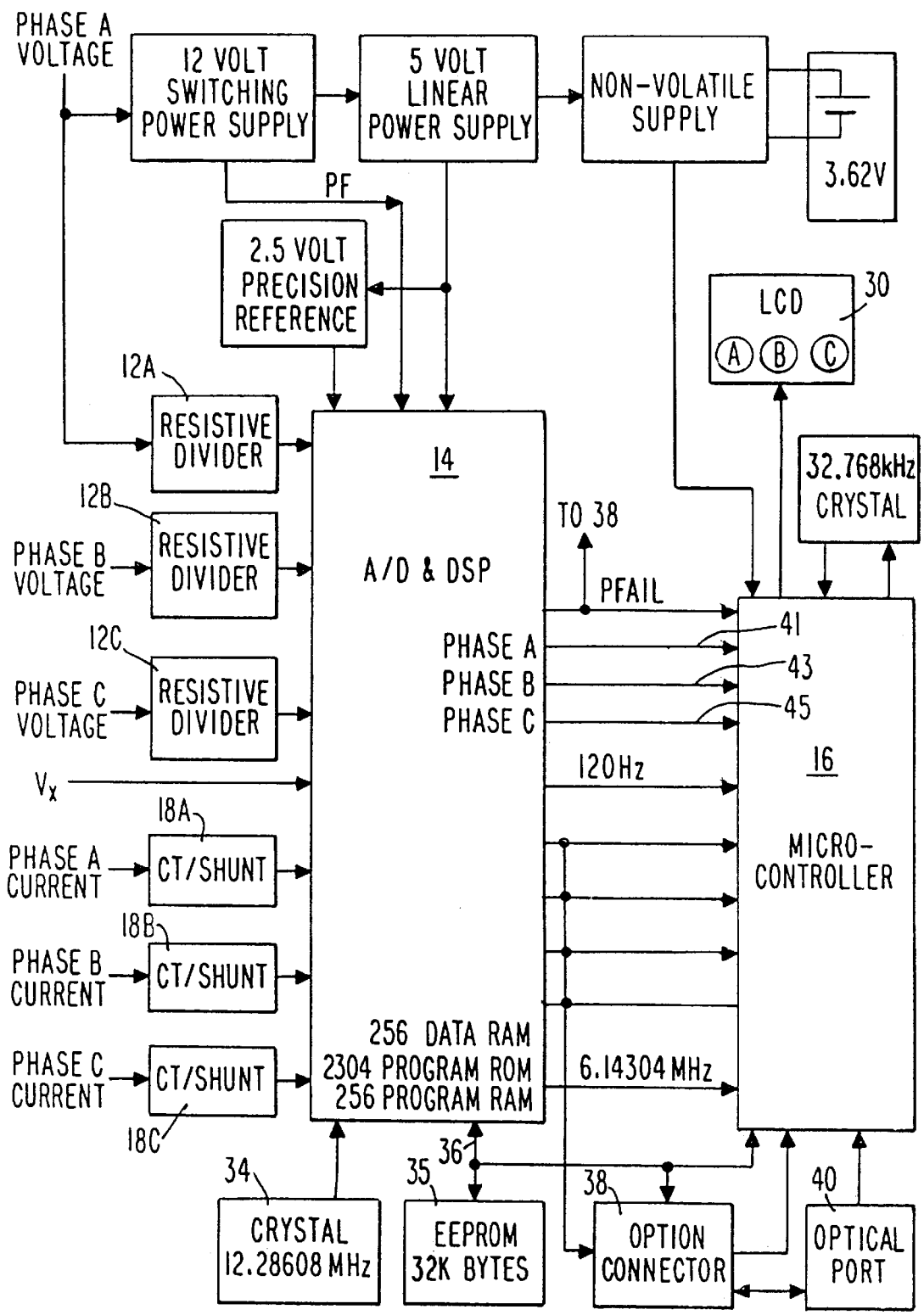
FIG. 1 is a block diagram showing the functional components of an exemplary meter and their interfaces in accordance with the present invention.

The present invention provides line frequency variation detection and compensation features in connection with metering single phase or polyphase electrical energy. FIG. 1 is a block diagram showing the functional components of an exemplary meter and their interfaces to which the present invention is applicable. The meter is described in the co-pending PCT application entitled "ENERGY METER WITH POWER QUALITY MONITORING AND DIAGNOSTIC SYSTEMS", No. PCT/US97/18547, having an international filing date of Oct. 16, 1997 (Attorney Docket No. ABME-0237), which is incorporated herein by reference.

As shown in FIG. 1, a meter for metering three-phase electrical energy preferably includes a digital LCD type display 30, a meter integrated circuit (IC) 14 which preferably comprises A/D converters and a programmable DSP, and a microcontroller 16.

Analog voltage and current signals propagating over power distribution lines between the power generator of the electrical service provider and the users of the electrical energy are sensed by voltage dividers 12A, 12B, 12C and current transformers or shunts 18A, 18B, 18C, respectively. The outputs of the resistive dividers 12A–12C and current transformers 18A–18C, or sensed voltage and current signals, are provided as inputs to the meter IC 14. The A/D converters in the meter IC 14 convert the sensed voltage and current signals into digital representations of the analog voltage and current signals. In a preferred embodiment, the A/D conversion is carried out as described in U.S. Pat. No. 5,544,089, dated Aug. 6, 1996, and entitled "PROGRAMMABLE ELECTRICAL METER USING MULTIPLEXED ANALOG-TO-DIGITAL CONVERTERS", assigned to ABB Power T & D Company. The digital voltage and current representations are then input to the microcontroller 16 through an IIC bus 36.

The microcontroller 16 preferably interfaces with the meter IC 14 and with one or more memory devices through an IIC bus 36. A memory, preferably a non-volatile memory such as an EEPROM 35, is provided to store nominal phase voltage and current data and threshold data as well as programs and program data. Upon power up after installation, a power failure, or a data altering communication, for example, selected data stored in the EEPROM 35 may be downloaded to the program RAM and data RAM associated within the meter IC 14, as shown in FIG. 1. The DSP under the control of the microcontroller 16 processes the digital voltage and current signals in accordance with the downloaded programs and data stored in the respective program RAM and data RAM.

To perform line frequency measurements and compensation, the meter IC 14 monitors the line frequency over, for example, two line cycles. It should be understood that the number of line cycles is preferably programmable and a different number of line cycles may be used for designated measurements.

Following power-up at installation, a service test can be performed to identify and/or check the electrical service. The meter may be preprogrammed for use with a designated service or it may determine the service using a service test. When the service test is used to identify the electrical service, an initial determination is made of the number of active elements. To this end, each element (i.e., 1, 2, or 3 elements) is checked for voltage. Once the number of elements is identified, many of the service types can be eliminated from the list of possible service types. The voltage phase angle relative to phase A may then be calculated and compared to each phase angle for abc or cba rotations with respect to the remaining possible services. If a valid service is found from the phase angle comparisons, the service voltage is preferably determined by comparing the RMS voltage measurements for each phase with nominal phase voltages for the identified service. If the nominal service voltages for the identified service matches measured values within an acceptable tolerance range, a valid service is identified and the phase rotation, service voltage, and service type are preferably displayed. The service may be locked, i.e., the service information is stored in a memory, preferably a non-volatile memory, such as the EEPROM 35, manually or automatically. Service types include 4-wire wye, 3-wire wye, 4-wire delta, 3-wire delta, or single phase.

When the service type is known in advance and locked, the service test preferably checks to ensure that each element is receiving phase potential and that the phase angles are within a predetermined percentage of the nominal phase angles for the known service. The per-phase voltages are also measured and compared to the nominal service voltages to determine whether they are within a predefined tolerance range of the nominal phase voltages. If the voltages and phase angles are within the specified ranges, the phase rotation, the service voltage, and service type are displayed on the meter display. If either a valid service is not found or the service test for a designated service fails, a system error code indicating an invalid service is displayed and locked on the display to ensure that the failure is noted and evaluated to correct the error.

The meter of FIG. 1 also provides for remote meter reading, remote power quality monitoring, and reprogramming through an optical port 40 and/or an option connector 38. Although optical communications may be used in connection with the optical port 40, the option connector 38 may be adapted for RF communications or electronic communications via modem, for example.

The systems for performing line frequency detection and compensation according to the present invention are preferably implemented in firmware, wherein such operations are enabled by the correct programming of data tables. However, the system of the present invention can be implemented in general purpose computers using software, or exclusively in special purpose hardware, or in a combination of the two.

The service type that the meter is connected to is determined as described above. After the service type is determined, the per phase voltage magnitudes are checked. If the per phase voltage magnitudes fall within the allowable parameters for all phases, then a nominal service voltage is determined. Determination of a valid type and a valid nominal service voltage for that type define detection of a valid service.

Voltage-to-voltage phase angles are used in the determination of the service type. Phase angle determination may be done in a number of different ways, including counting samples between similar voltage zero crossings or by doing a Discrete Fourier Transform (DFT) between one of the phase voltages of interest and an ideal signal triggered by the other voltage of interest. Most techniques for measuring the phase angles between two sinusoidal signals are frequency-dependent. Thus, the determination of the service type that the meter is connected to is an example of a frequency-dependent determination.

Assuming that the energy meter does its discrete sampling at fixed time intervals, the equivalent angle between each sample is directly proportional to the line frequency. This proportionality to the line frequency causes errors in the voltage-to-voltage phase angle measurement in both methods described above, unless frequency compensation is used.

To perform frequency compensation, the present frequency is desirably known. When the meter is known to be sampling the signals at known discrete time intervals, counting the number of samples between like zero crossings (line cycles) can be used as a method to determine present line frequency. More than one line cycle may be used if the average number of samples per line cycle is calculated. Any integer number of line cycles (greater than or equal to one) may be used, but the greater the number of line cycles, the more accurate the value of the present line frequency.

Use of DFT

Figure 2A:
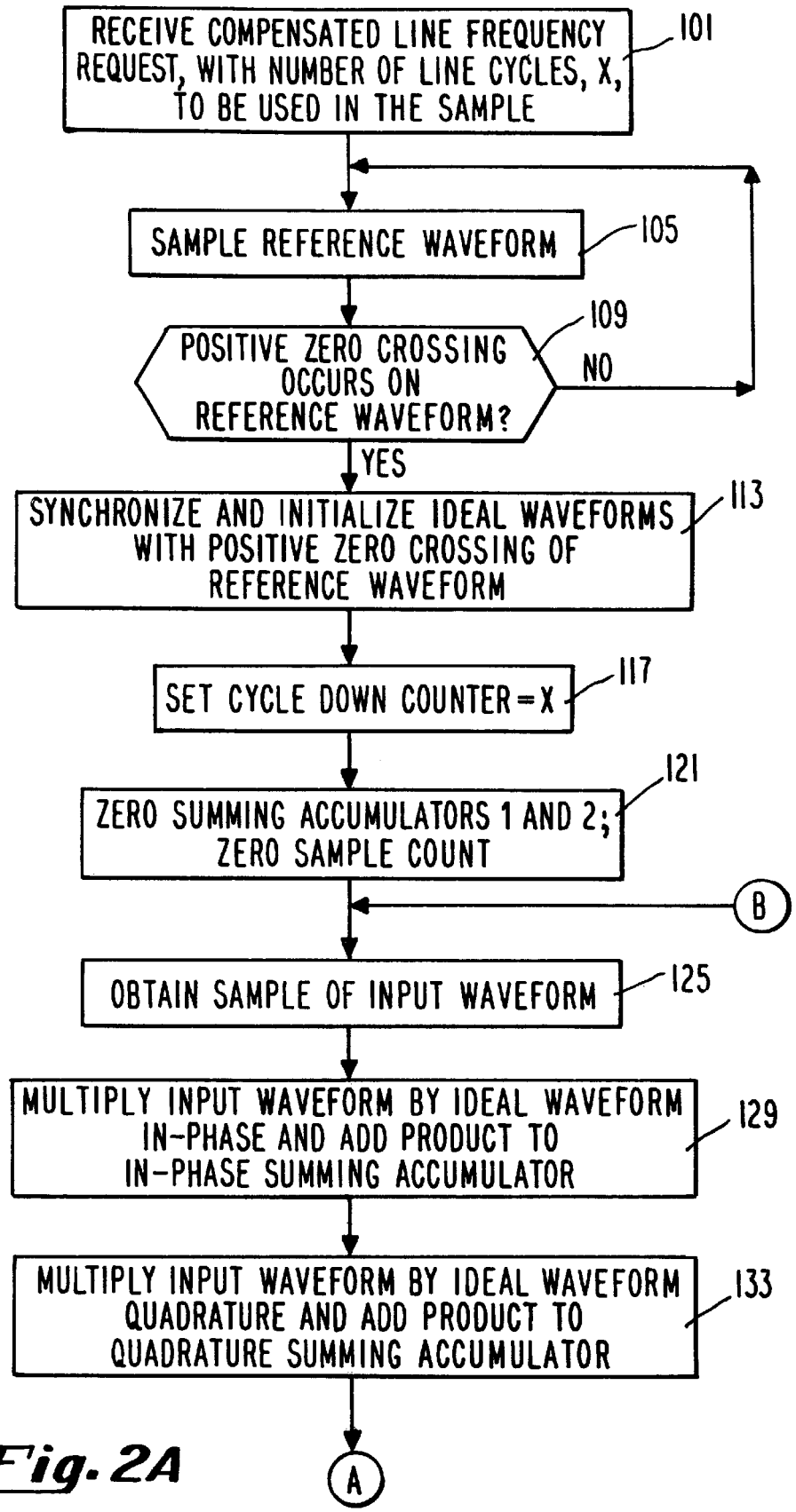
FIGS. 2A and 2B show an exemplary DFT method in accordance with the present invention.
Figure 2B:
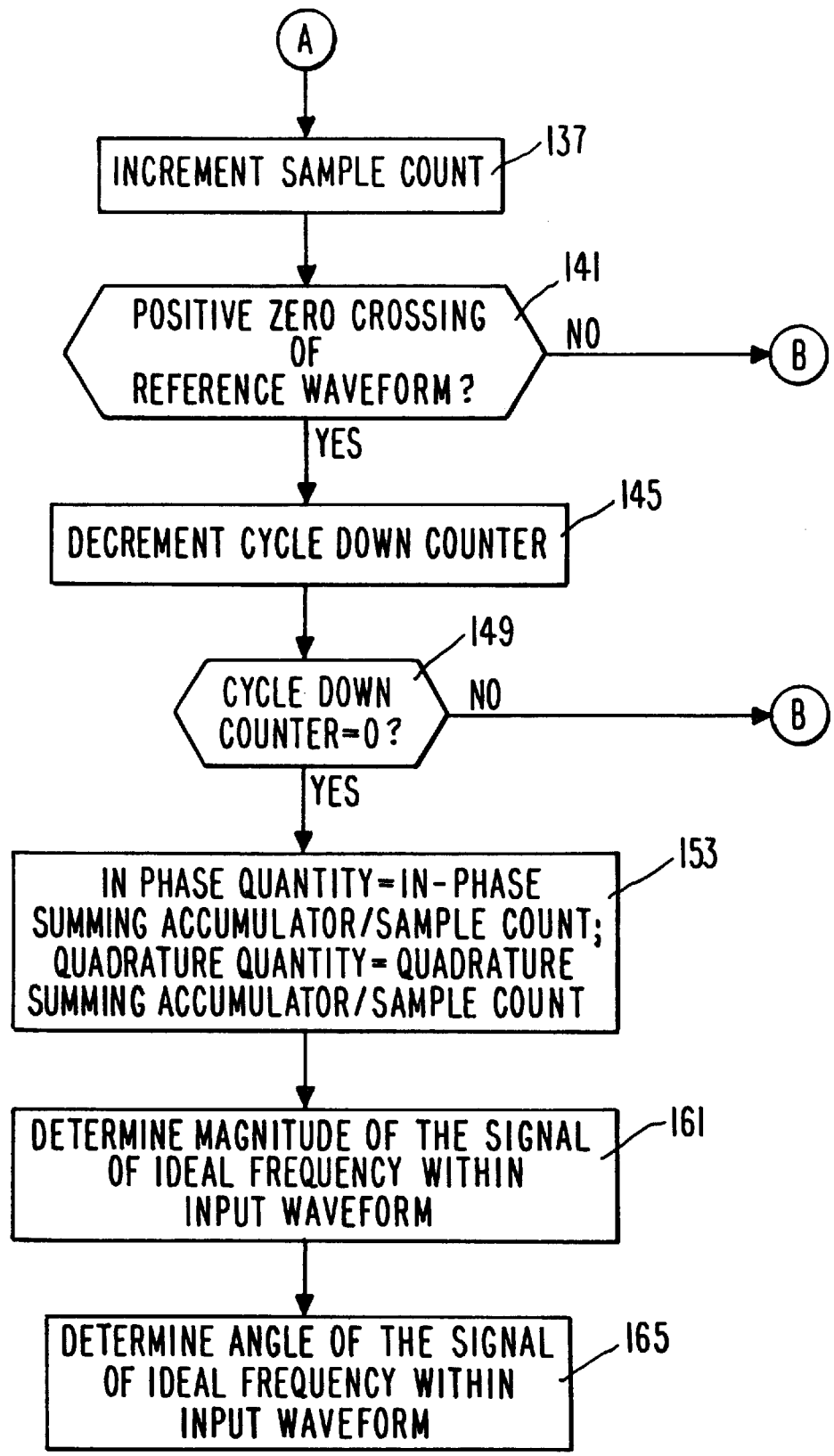

An exemplary method of compensating for line frequency variations in accordance with the present invention is shown in FIGS. 2A and 2B. A DFT is used to determine the content of one particular frequency signal within an input signal. The one particular frequency will be referred to herein as the ideal frequency. A reference waveform is also used to synchronize Ideal Waveforms, described below. The input signal is referred to herein as the Input Waveform, and it may be made up of a fundamental frequency, and any number of its harmonics.

As described in further detail below, the DFT is determined by multiplying the Input Waveform by two Ideal Waveforms of the same ideal frequency. One Ideal Waveform is 90 degrees out of phase with the other Ideal Waveform; i.e., one Ideal Waveform is the in-phase component and the other Ideal Waveform is the quadrature component. The Input Waveform is thus multiplied separately by the two Ideal Waveforms. In the preferred digital sampling implementation, the products are averaged separately over a programmable number, X, of complete line cycles. A single line cycle is used for the description herein for simplicity of explanation, but the same concepts apply for use with averaging over multiple line cycles.

It is desired to accurately determine the phase angle between the fundamental frequencies of two real time signals (the Input Waveform and the reference waveform). To accurately determine the phase angle using a DFT, the actual line frequency is used as the ideal frequency of the two Ideal Waveforms, and the two Ideal Waveforms are synchronized with the reference waveform. It should be noted that the reference waveform is not being analyzed, it is merely being used as a reference.

If the actual line frequency (of the Input Waveform and the reference waveform) is not known and differs from the nominal, and the two Ideal Waveforms are of the nominal line frequency, then the result will be in error as compared to the actual angle. Additionally, frequency synchronization problems also lead to errors in calculated magnitudes, as compared to actual magnitudes.

Furthermore, in a digital sampling system, referencing or synchronizing an Ideal Waveform to a real time repetitive waveform (such as the reference waveform) poses some problems. Any error in synchronization translates to a direct error in the resultant phase angle value. A point of reference on a repetitive reference waveform is the zero crossing. Zero crossings are determined by calculating the product of two successive samples. If the product is positive, then no zero crossing has occurred. If the product is negative and the first sample was positive, a negative zero crossing has occurred. If the product is negative and the first sample was negative, a positive zero crossing has occurred.

Variance in the phase angles of the harmonics can cause the zero crossings not to occur at exactly the zero degree point of the fundamental frequency. In real world applications, the voltages are typically dominated by the fundamental, and a small variation in zero crossing angular location does not make a significant difference. The objective is to synchronize the Ideal Waveform to the reference waveform. However, if the Ideal Waveform is not initiated until a zero crossing is seen in the actual sample data, the Ideal Waveform could lag the actual waveform by as much as one sample time.

To address the previously noted problems, several methods can be employed. Knowledge of the present line frequency can be used to compensate for the problem of variation of line frequency from nominal. Knowledge of the present line frequency can be achieved (1) by measuring the present line frequency just prior to measurement of any frequency-dependent quantity, or (2) by periodically measuring present line frequency and storing its averaged value. The first method takes longer when the measurement is desired, but results in a line frequency detected closer to the actual time of measurement, and also uses less memory storage, as compared with the second method of determining an average line frequency on an ongoing basis. However, the method of averaging allows improved accuracy from longer averaging of line frequency, and an improvement in speed since only the measurement needs to be made (without the additional time required to do a frequency measurement first).

Power line frequency does not typically change by large amounts, and typically not very fast. So the preferred implementation uses a slight variation of the first method noted above. In this method there may be a number of measurements made that are all frequency-dependent. These measurements are grouped together so that they will all be made as soon as possible after each other, and a single line frequency measurement is made at the beginning of the measurement sequence, and the same adjusted frequency is used as the ideal frequency to generate the two Ideal Waveforms for each DFT measurement.

Prior to step 101, an instrumentation request is made from microcontroller 16 to meter IC 14 to determine the actual line frequency. Then at step 101, a compensated line frequency request is received by the meter IC 14 from the microcontroller 16, along with the number of line cycles, X, that are to be used in the sample. At step 105, a reference signal (i.e., a reference waveform) is sampled. At step 109, the reference waveform is checked to determine if it is at a zero crossing. If it is not, another sample of the reference waveform is obtained at step 105.

If a positive zero crossing of the reference waveform is detected at step 109, then the Ideal Waveforms are synchronized and initialized at step 113. A cycle down counter is set to the number of line cycles that are to be sampled, at step 117. Summing accumulators 1 and 2 (referring to an in-phase summing accumulator and a quadrature summing accumulator, respectively) and sample count are initialized (set to zero) at step 121. A sample of the Input Waveform is obtained at step 125. The Input Waveform is multiplied by the Ideal Waveform in-phase, at step 129, and the product is added to the in-phase summing accumulator. The Input Waveform is multiplied by the Ideal Waveform quadrature, at step 133, and the product is added to the quadrature summing accumulator.

At step 137, the sample count is incremented, and step 141 samples the reference waveform to determine if a positive zero crossing has occurred. If the reference waveform is not at a positive zero crossing, another sample of the Input Waveform is obtained, and processing continues at step 125. If the reference waveform is at a positive zero crossing at step 141, then the cycle down counter is decremented, at step 145. At step 149, the value of the cycle down counter is checked. If the value is not zero, then another sample of the Input Waveform is obtained, and processing continues at step 125. If the value of the cycle down counter is zero at step 149, then the in-phase quantity and the quadrature quantity are determined at step 153. The in-phase quantity is equal to the value in the in-phase summing accumulator divided by the sample count, and the quadrature quantity is equal to the quadrature summing accumulator divided by the sample count.

The resultant in-phase and quadrature quantities (averages) are proportional to the in-phase and quadrature components of the ideal frequency signal within the Input Waveform. The magnitude of the resultant in-phase and quadrature quantities (averages) are determined, at step 161, by the square root of the sum of the squares of the in-phase and quadrature quantities. The magnitude is equivalent to the product of the RMS value of the ideal frequency signal within Input Waveform and the RMS value of either of the Ideal Waveforms. (It is assumed that the RMS values of both of the two Ideal Waveforms are the same. Typically, the peak value of the Ideal Waveforms is 1, resulting in an RMS value of $(1/\sqrt{2})$.) So by dividing the resultant magnitude by the RMS value of one of the Ideal Waveforms, the magnitude of the signal of ideal frequency within Input Waveform is determined.

The angle of the signal of ideal frequency within Input Waveform is determined, at step 165, with respect to the ideal input signals by use of the in-phase and quadrature terms. The resultant phase angle is determined by:

| Sign of in phase quantity | Sign of quadrature quantity | Angle calculation (in degrees) |
| --- | --- | --- |
| + | + | Arctan(quadrature/in phase) + 0° |
| − | + | Arctan(quadrature/in phase) + 180° |
| − | − | Arctan(quadrature/in phase) + 180° |
| + | − | Arctan(quadrature/in phase) + 360° |

Although the in-phase and quadrature terms are a function of the RMS values of the two Ideal Waveforms, the RMS values of the two Ideal Waveforms do not have to be removed as in the magnitude determination. Because they have identical values in both in-phase and quadrature terms, and the arctan function is performed on the quotient of the quadrature and in-phase values, the RMS values from the two Ideal Waveforms cancel out.

For determination of the voltage-to-voltage phase angle of the fundamental line frequency, counting of samples is less complex, but use of the DFT for this application allows a common function to be used for multiple purposes. In addition to the detection of the nominal phase angles, this functionality allows detection of individual harmonic values of higher frequencies. Availability of this functionality in addition to ability to calculate RMS quantities, allows calculation of total harmonic distortion quantities.

Thus, the present invention adjusts for frequency variable measurements due to variations in line frequency by determining line frequency prior to measurement of a frequency variable quantity. Furthermore, adjustment is made by changing the ideal frequency of the two Ideal Waveforms used for in-phase and quadrature measurements.

Moreover, the present line frequency is determined either by measurement of frequency immediately prior to a measurement, or on an ongoing repetitive basis, and using the last detected value as the present line frequency.

Although illustrated and described herein with reference to certain specific embodiments, the present invention is nevertheless not intended to be limited to the details shown. Rather, various modifications may be made in the details within the scope and range of equivalents of the claims and without departing from the invention.

What is claimed:

1. A method of measuring frequency dependent electrical parameters by an energy meter in an electrical system that provides electrical energy having a varying frequency, comprising the steps of:

measuring a frequency of the electrical energy;

selecting a reference waveform having a positive zero crossing;

synchronizing two ideal waveforms with said reference waveform, said two ideal waveforms each having an ideal frequency;

obtaining an input signal waveform; and determining a magnitude of a signal of said ideal frequency within said input signal waveform, wherein said two ideal waveforms are a function of said frequency and are approximately 90 degrees out of phase with one another, one ideal waveform representing an in-phase component and the other ideal waveform representing a quadrature component.

2. The method according to claim 1, wherein the step of measuring said frequency comprises the steps of determining a time interval between a plurality of samples of a signal waveform and counting a number of samples between a plurality of zero crossings of said signal waveform.

3. The method according to claim 1, further comprising the step of determining an angle of said signal of said ideal frequency within said input signal waveform with respect to said reference waveform.

4. The method according to claim 1, further comprising the steps of:

multiplying said input signal waveform by said in-phase ideal waveform to produce an in-phase product for each sample of a plurality of samples in a line cycle, for at least one line cycle;

adding said in-phase product for each said sample to an in-phase summing accumulator to produce an in-phase summing value;

multiplying said input signal waveform by said quadrature ideal waveform to produce a quadrature product for each sample of said plurality of samples in a line cycle, for said plurality of line cycles; and adding said quadrature product for each said sample to a quadrature summing accumulator to produce a quadrature summing value.

5. The method according to claim 4, further comprising the step of determining an in-phase quantity and a quadrature quantity.

6. The method according to claim 5, further comprising the step of counting a number of samples in said plurality of line cycles to determine a sample count, wherein said in-phase quantity=said in-phase summing value/said sample count, and said quadrature quantity= said quadrature summing value/said sample count.

7. The method according to claim 5, wherein said magnitude and angle of said signal of said ideal frequency within said input signal waveform are responsive to said in-phase quantity and said quadrature quantity.

8. The method according to claim 7, further comprising the step of determining said magnitude of said signal of said ideal frequency by a square root of the sum of the squares of said in-phase and quadrature quantities multiplied by a scale factor that is a function of the RMS value of one of said ideal waveforms.

9. The method according to claim 7, wherein said step of determining said angle comprises determining said angle in accordance with the table:

| Sign of in-phase quantity | Sign of quadrature quantity | Angle calculation (in degrees) |
| --- | --- | --- |
| + | + | Arctan(quadrature/in-phase) + 0° |
| − | + | Arctan(quadrature/in-phase) + 180° |
| − | − | Arctan(quadrature/in-phase) + 180° |
| + | − | Arctan(quadrature/in-phase) + 360°. |

10. A system for measuring frequency dependent electrical parameters by an energy meter in an electrical system that provides electrical energy having a varying frequency via a service type, comprising:

means for measuring a frequency of the electrical energy;

means for selecting a reference waveform having a positive zero crossing;

means for synchronizing two ideal waveforms with said reference waveform, said two ideal waveforms each having an ideal frequency;

means for obtaining an input signal waveform; and means for determining a magnitude of a signal of said ideal frequency within said input signal waveform, wherein said two ideal waveforms are a function of said frequency and are approximately 90 degrees out of phase with one another, one ideal waveform representing an in-phase component and the other ideal waveform representing a quadrature component.

11. The system according to claim 10, wherein said means for measuring said frequency comprises means for determining a time interval between a plurality of samples of a signal waveform and means for counting a number of samples between a plurality of zero crossings of said signal waveform.

12. The system according to claim 10, further comprising means for determining an angle of said signal of said ideal frequency within said input signal waveform with respect to said reference waveform.

13. The system according to claim 10, further comprising:

means for multiplying said input signal waveform by said in-phase ideal waveform to produce an in-phase product for each sample of a plurality of samples in a line cycle, for at least one line cycle;

means for adding said in-phase product for each said sample to an in-phase summing accumulator to produce an in-phase summing value;

means for multiplying said input signal waveform by said quadrature ideal waveform to produce a quadrature product for each sample of said plurality of samples in a line cycle, for said plurality of line cycles; and means for adding said quadrature product for each said sample to a quadrature summing accumulator to produce a quadrature summing value.

14. The system according to claim 13, further comprising means for determining an in-phase quantity and a quadrature quantity.

15. The system according to claim 14, further comprising means for counting a number of samples in said plurality of line cycles to determine a sample count, wherein said in-phase quantity=said in-phase summing value/said sample count, and said quadrature quantity= said quadrature summing value/said sample count.

16. The system according to claim 14, wherein said magnitude and angle of said signal of said ideal frequency within said input signal waveform are responsive to said in-phase quantity and said quadrature quantity.

17. The system according to claim 16, further comprising means for determining said magnitude of said signal of said ideal frequency by a square root of the sum of the squares of said in-phase and quadrature quantities multiplied by a scale factor that is a function of the RMS value of one of said ideal waveforms.

18. The system according to claim 16, wherein said means for determining said angle comprises means for determining said angle in accordance with the table:

| Sign of in-phase quantity | Sign of quadrature quantity | Angle calculation (in degrees) |
| --- | --- | --- |
| + | + | Arctan(quadrature/in-phase) + 0° |
| − | + | Arctan(quadrature/in-phase) + 180° |
| − | − | Arctan(quadrature/in-phase) + 180° |
| + | − | Arctan(quadrature/in-phase) + 360°. |

19. An apparatus comprising storage means that stores software that measures frequency dependent electrical parameters in an electrical system that provides electrical energy having a varying frequency via an energy meter and performs the steps of:

measuring a frequency of electrical energy;

selecting a reference waveform having a positive zero crossing;

synchronizing two ideal waveforms with said reference waveform, said two ideal waveforms each having an ideal frequency;

obtaining an input signal waveform; and determining a magnitude of a signal of said ideal frequency within said input signal waveform, wherein said two ideal waveforms are a function of said frequency and are approximately 90 degrees out of phase with one another, one ideal waveform representing an in-phase component and the other ideal waveform representing a quadrature component.

20. The apparatus according to claim 19, wherein said software performs the steps of determining a time interval between a plurality of samples of a signal waveform and counting a number of samples between a plurality of zero crossings of said signal waveform.

21. The apparatus according to claim 19, wherein said software further performs the step of determining an angle of said signal of said ideal frequency within said input signal waveform with respect to said reference waveform.

22. The apparatus according to claim 19, wherein said software further performs the steps of:
  multiplying said input signal waveform by said in-phase ideal waveform to produce an in-phase product for each sample of a plurality of samples in a line cycle, for at least one line cycle;
  adding said in-phase product for each said sample to an in-phase summing accumulator to produce an in-phase summing value;
  multiplying said input signal waveform by said quadrature ideal waveform to produce a quadrature product for each sample of said plurality of samples in a line cycle, for said plurality of line cycles; and
  adding said quadrature product for each said sample to a quadrature summing accumulator to produce a quadrature summing value.

23. The apparatus according to claim 22, wherein said software further performs the step of determining an in-phase quantity and a quadrature quantity.

24. The apparatus according to claim 23, wherein said software further performs the step of counting a number of samples in said plurality of line cycles to determine a sample count,
  wherein said in-phase quantity=said in-phase summing value/said sample count, and said quadrature quantity= said quadrature summing value/said sample count.

25. The apparatus according to claim 23, wherein said magnitude and angle of said signal of said ideal frequency within said input signal waveform are responsive to said in-phase quantity and said quadrature quantity.

26. The apparatus according to claim 25, wherein said software further performs the step of determining said magnitude of said signal of said ideal frequency by a square root of the sum of the squares of said in-phase and quadrature quantities multiplied by a scale factor that is a function of the RMS value of one of said ideal waveforms.

27. The apparatus according to claim 25, wherein said software determines said angle in accordance with the table:

| Sign of in-phase quantity | Sign of quadrature quantity | Angle calculation (in degrees) |
| --- | --- | --- |
| + | + | Arctan(quadrature/in-phase) + 0° |
| − | + | Arctan(quadrature/in-phase) + 180° |
| − | − | Arctan(quadrature/in-phase) + 180° |
| + | − | Arctan(quadrature/in-phase) + 360°. |

28. A method of measuring frequency dependent electrical parameters by an energy meter in an electrical system that provides electrical energy having a varying frequency, comprising the steps of:
  selecting a reference waveform having a positive zero crossing;
  synchronizing two ideal waveforms with said reference waveform, said two ideal waveforms each having an ideal frequency;
  obtaining an input signal waveform; and
  determining a magnitude of a signal of said ideal frequency within said input signal waveform,
  wherein said two ideal waveforms are approximately 90 degrees out of phase with one another, one ideal waveform representing an in-phase component and the other ideal waveform representing a quadrature component.

29. The method according to claim 28, further comprising the step of determining an angle of said signal of said ideal frequency within said input signal waveform with respect to said reference waveform.

30. The method according to claim 28, further comprising the steps of:
  multiplying said input signal waveform by said in-phase ideal waveform to produce an in-phase product for each sample of a plurality of samples in a line cycle, for at least one line cycle;
  adding said in-phase product for each said sample to an in-phase summing accumulator to produce an in-phase summing value;
  multiplying said input signal waveform by said quadrature ideal waveform to produce a quadrature product for each sample of said plurality of samples in a line cycle, for said plurality of line cycles; and
  adding said quadrature product for each said sample to a quadrature summing accumulator to produce a quadrature summing value.

31. The method according to claim 30, further comprising the step of determining an in-phase quantity and a quadrature quantity.

32. The method according to claim 31, further comprising the step of counting a number of samples in said plurality of line cycles to determine a sample count,
  wherein said in-phase quantity=said in-phase summing value/said sample count; and
  said quadrature quantity=said quadrature summing value/said sample count.

33. The method according to claim 31, wherein said magnitude and angle of said signal of said ideal frequency within said input signal waveform are responsive to said in-phase quantity and said quadrature quantity.

34. The method according to claim 33, further comprising the step of determining a magnitude of said signal of said ideal frequency by a square root of the sum of the squares of said in-phase and quadrature quantities multiplied by a scale factor that is a function of the RMS value of one of said ideal waveforms.

35. The method according to claim 33, wherein said step of determining said angle comprises determining said angle in accordance with the table:

| Sign of in-phase quantity | Sign of quadrature quantity | Angle calculation (in degrees) |
| --- | --- | --- |
| + | + | Arctan(quadrature/in-phase) + 0° |
| − | + | Arctan(quadrature/in-phase) + 180° |
| − | − | Arctan(quadrature/in-phase) + 180° |
| + | − | Arctan(quadrature/in-phase) + 360°. |

36. A system for measuring frequency dependent electrical parameters by an energy meter in an electrical system that provides electrical energy having a varying frequency via a service type, comprising:

means for selecting a reference waveform having a positive zero crossing;

means for synchronizing two ideal waveforms with said reference waveform, said two ideal waveforms each having an ideal frequency;

means for obtaining an input signal waveform; and means for determining a magnitude of a signal of said ideal frequency within said input signal waveform, wherein said two ideal waveforms are approximately 90 degrees out of phase with one another, one ideal waveform representing an in-phase component and the other ideal waveform representing a quadrature component.

37. The system according to claim 36, further comprising means for determining an angle of said signal of said ideal frequency within said input signal waveform with respect to said reference waveform.

38. The system according to claim 36, further comprising:

means for multiplying said input signal waveform by said in-phase ideal waveform to produce an in-phase product for each sample of a plurality of samples in a line cycle, for at least one line cycle;

means for adding said in-phase product for each said sample to an in-phase summing accumulator to produce an in-phase summing value;

means for multiplying said input signal waveform by said quadrature ideal waveform to produce a quadrature product for each sample of said plurality of samples in a line cycle, for said plurality of line cycles; and means for adding said quadrature product for each said sample to a quadrature summing accumulator to produce a quadrature summing value.

39. The system according to claim 38, further comprising means for determining an in-phase quantity and a quadrature quantity.

40. The system according to claim 39, further comprising means for counting a number of samples in said plurality of line cycles to determine a sample count, wherein said in-phase quantity=said in-phase summing value/said sample count; and said quadrature quantity=said quadrature summing value/said sample count.

41. The system according to claim 39, wherein said magnitude and angle of said signal of said ideal frequency within said input signal waveform are responsive to said in-phase quantity and said quadrature quantity.

42. The system according to claim 41, further comprising means for determining a magnitude of said ideal frequency by a square root of the sum of the squares of said in-phase and quadrature quantities multiplied by a scale factor that is a function of the RMS value of one of said ideal waveforms.

43. The system according to claim 41, wherein said means for determining said angle comprises means for determining said angle in accordance with the table:

| Sign of in-phase quantity | Sign of quadrature quantity | Angle calculation (in degrees) |
|---|---|---|
| + | + | Arctan(quadrature/in-phase) + 0° |
| − | + | Arctan(quadrature/in-phase) + 180° |
| − | − | Arctan(quadrature/in-phase) + 180° |
| + | − | Arctan(quadrature/in-phase) + 360°. |

* * * * *